United States Patent
Kobashi

(10) Patent No.: US 8,827,759 B2
(45) Date of Patent: Sep. 9, 2014

(54) METHOD OF MANUFACTURING LIGHT EMITTING DEVICE

(71) Applicant: Masaki Kobashi, Tokushima (JP)

(72) Inventor: Masaki Kobashi, Tokushima (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 13/834,343

(22) Filed: Mar. 15, 2013

(65) Prior Publication Data

US 2013/0214286 A1  Aug. 22, 2013

Related U.S. Application Data

(63) Continuation of application No. 13/281,103, filed on Oct. 25, 2011, now Pat. No. 8,471,454.

(30) Foreign Application Priority Data

Nov. 5, 2010 (JP) ................................ 2010-248343

(51) Int. Cl.
| | |
|---|---|
| H01J 9/26 | (2006.01) |
| H01J 9/32 | (2006.01) |
| C09K 11/02 | (2006.01) |
| H01L 33/50 | (2010.01) |
| C09K 11/77 | (2006.01) |

(52) U.S. Cl.
CPC ............ *H01L 33/507* (2013.01); *C09K 11/025* (2013.01); *H01L 2933/0041* (2013.01); *H01L 33/504* (2013.01); *C09K 11/7774* (2013.01)

USPC ............ 445/25; 438/36; 313/483; 313/501; 313/502; 427/240

(58) Field of Classification Search
USPC .......... 257/40, 72, 98–100; 315/169.1, 169.3; 427/58, 64, 66, 532–535, 539; 438/26–29, 34, 82; 445/24–25
See application file for complete search history.

(56) References Cited

U.S. PATENT DOCUMENTS

| | | | |
|---|---|---|---|
| 2006/0001352 | A1 | 1/2006 | Maruta et al. |
| 2008/0218072 | A1* | 9/2008 | Haruna et al. ............... 313/506 |
| 2010/0112734 | A1 | 5/2010 | Koizumi |
| 2010/0237367 | A1* | 9/2010 | Lee et al. ..................... 257/98 |
| 2010/0289051 | A1 | 11/2010 | Lee et al. |
| 2010/0301373 | A1* | 12/2010 | Urano et al. .................. 257/98 |

FOREIGN PATENT DOCUMENTS

| | | |
|---|---|---|
| JP | 2000-164937 | 6/2000 |
| JP | 2005-277331 | 10/2005 |
| JP | 2008-311477 | 12/2008 |

* cited by examiner

*Primary Examiner* — Donald Raleigh
(74) *Attorney, Agent, or Firm* — Antonelli, Terry, Stout & Kraus, LLP.

(57) ABSTRACT

To make a light emitting device, a light emitting element is placed in a recess of a package, powders having a fluorescent material and coated with inorganic particles are provided, the fluorescent powders, fillers and a resin are mixed, the light emitting element placed in the recess of the package is sealed with the resin, and a centrifugal force is applied to the sealed package so that the fluorescent powders and the fillers sediment are pushed toward a bottom of the recess.

26 Claims, 2 Drawing Sheets

METHOD OF MANUFACTURING LIGHT EMITTING DEVICE

This application is a continuation of application Ser. No. 13/281,103, filed Oct. 25, 2011, the contents of which are incorporated herein by reference.

This application claims priority from Japanese Patent Application No. 2010-248343 filed on Nov. 5, 2010, the content of which is incorporated herein by reference in its entirety.

BACKGROUND OF THE INVENTION

1. Field of the Invention

The present invention relates to a light emitting device using a light emitting element and a method of manufacturing the light emitting device, particularly to a light emitting device in which a light emitting element is sealed with a resin, and to a method of manufacturing the light emitting device.

2. Description of Related Art

A light emitting device using a light emitting element is small in size and has a low power consumption with long service life, and is used in a wide variety of applications such as backlight for liquid crystal displays and in-car devices. Typically, the light emitting element is sealed with a resin when it is incorporated in a light emitting device for protection of a wire-bonded portion and other wiring portions, and for protection of the light emitting element itself.

Light emitted from the light emitting element is a single-color light such as red, green, or blue, and a fluorescent material for converting it to light having a different wavelength may be used in combination with the light emitting element. For example, a light emitting device is known, which is capable of emitting white light by additive mixing of colors of the light emitted from an LED exiting directly to the outside and the wavelength-converted light emitted from the light emitting element.

Conventionally, a light emitting device having a light emitting element sealed with a resin which contains a fluorescent material is disclosed for example in JP 2005-277331A, in which the density of the fluorescent material in the resin and the viscosity of the uncured resin are adjusted to minimize deposition of the fluorescent material and to prevent the fluorescent material from covering the surface of the light emitting element.

With this, a decrease in the light extraction efficiency of the light emitting element and loss in propagation of light caused by the fluorescent material are suppressed and thus improvement in the emission intensity of the light emitting device are obtained.

Also, a semiconductor light emitting device having a light emitting element sealed in a resin package is disclosed for example in JP 2000-164937A in which the resin package has a two-layer structure of a sealing resin layer and a fluorescent material layer containing a fluorescent material for converting the emission wavelength, where the two layers include a resin as a common material, and the fluorescent material for converting color of light is arranged in the vicinity of the light emitting element.

This arrangement suppresses occurrence of detachment at the interface between the resin layers and an optical warpage due to encapsulation with a plurality of resin layers, and to reduce exposure of the fluorescent substance near the surface of the resin layer to external light so that emission caused by an excitation of the fluorescent substance by external light can be prevented.

However, in such a light emitting device described in JP 2005-277331A, the fluorescent substance is dispersed in a resin, so that light from the light emitting element hits the fluorescent substance dispersed in the resin multiple times and attenuates. Also, a difference occurs in the amount of resin used to seal the light emitting element by way of potting or printing, resulting in difference in the amount of the fluorescent substance included in each of the light emitting devices. Accordingly, the difference in the amount of light increases between the light from the light emitting element and the wavelength-converted light from the fluorescent substance which absorbed the light from the light emitting element. In such a semiconductor light emitting device described in JP 2000-164937A, the fluorescent substance is over-packed in the vicinity of the light emitting layer of the light emitting element, which makes it difficult to extract light from the light emitting element to outside and may result in color unevenness.

SUMMARY OF THE INVENTION

The invention provides a method of manufacturing a light emitting device. The method includes placing a light emitting element in a recess of a package, providing powders comprising a fluorescent material and coated with inorganic particles, mixing the fluorescent powders, fillers and a resin, sealing the light emitting element placed in the recess of the package with the resin having the fluorescent powders and the fillers mixed therein, and applying a centrifugal force to the sealed package so that the fluorescent powders and the fillers are pushed toward a bottom of the recess.

The invention also provides a light emitting device that includes a package having a recess, a light emitting element including a light emitting layer and disposed in the recess, a first lower layer having fluorescent particles and disposed on a bottom of the recess, a second lower layer having the fluorescent particles and disposed on a top of the light emitting element, and a first upper layer having fillers and disposed on the first lower layer. The first upper layer covers a side edge of the light emitting layer. The device also includes a second upper layer having the fillers and disposed on the second lower layer, and a resin sealing the light emitting element, the first and second lower layers and the first and second upper layers in the recess.

DETAILED DESCRIPTION OF THE INVENTION

Figure 1:
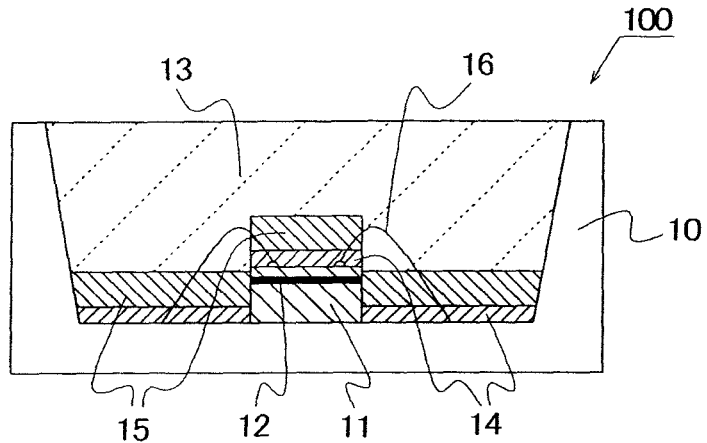
FIG. 1 is a schematic cross-sectional view of a light emitting element according to a first embodiment of the present invention.

Preferred embodiments of the present invention will be described below with reference to the accompanying drawings. The preferred embodiments are intended as illustrative of a light emitting device and a method of manufacturing the light emitting device to give a concrete form to technical ideas of the present invention, and the scope of the invention is not limited to those described below.

The sizes, materials, shapes and the relative configuration etc. of the members described in embodiments are given as an example and not as a limitation to the scope of the invention unless specifically described otherwise. The sizes and the arrangement relationships of the members in each of drawings are occasionally shown exaggerated for ease of explanation. In the description below, the same designations or the same reference numerals denote the same or like members and duplicative descriptions will be appropriately omitted. In addition, a plurality of structural elements of the present invention may be configured as a single part which serves the purpose of a plurality of elements, on the other hand, a single structural element may be configured as a plurality of parts which serve the purpose of a single element.

A first embodiment of the present invention will be described in detail below with reference to accompanying drawings. FIG. 1 is a schematic cross-sectional view of a light emitting element according to a first embodiment of the present invention. FIGS. 3(A) to 3(C) are schematic views illustrating a step of a method of manufacturing according to the present invention, showing fluorescent material having inorganic particles on the respective surfaces.

A light emitting device according to a first embodiment includes a package 10, a light emitting element 11 having a light emitting layer 12, a resin 13, a deposited layer of fluorescent material 14, a deposited layer of filler 15, and wires 16. The light emitting element 11 having the light emitting layer 12 is disposed in a face-up manner on the bottom surface of the recess defined in the package 10, and a pair of positive and negative electrodes (not shown) of the light emitting element 11 are connected to the corresponding lead electrodes (not shown) respectively fixed to the package by a bonding wire 16. The light emitting element 11 fixed on the bottom surface of the recess defined in the package 10 is sealed with the light transmissive resin 13.

The deposited layer of fluorescent material 14 is disposed on the upper surface of the light emitting element 11 and on the bottom surface of the recess defined in the package 10 so as to be lower than the light emitting layer 12 so that the light emitting layer 12 is exposed from the deposited layer of fluorescent material 14 at the side surfaces of the light emitting element 11.

The deposited layer of filler 15 is further disposed at least on the upper surface of each portion of the deposited layer of fluorescent material 14. It is sufficient that the light emitting layer 12 is at least exposed from the deposited layer of fluorescent material 14 and may be covered with the deposited layer of filler 15. It is preferable to cover the light emitting layer 12 with the deposited layer of filler 15 so that the light emitted from the light emitting layer 11 in a side direction of the light emitting element 11 and the light emitted from the light emitting layer 12 and wavelength converted at the deposited layer of fluorescent material 14 at the bottom surface of the recess defined in the package 10 can be diffused while passing through the deposited layer of filler 15, which contributes further mixing the colors of light.

The deposited layer of fluorescent material 14 is a deposit of the fluorescent material 20 having inorganic particles 22 on its surface, and has a thickness of 20 to 150 µm. In the present embodiment of the invention, the term "having inorganic particles 22 on its surface" means that the inorganic particles 22 are fine particles with diameters much smaller than the fluorescent material particles 21 and are adhered (coated) on the surfaces of the fluorescent material particles 21, in such a manner that, the inorganic particles 22 are aggregated to cover the entire surface of a fluorescent material particle 21 or to adhere to the surface of a fluorescent material particle exposing a part of the surface of the fluorescent material particle 21.

A light diffusing agent may be contained in the resin 13. In such case, the light diffusing agent is not deposited but is dispersed in the resin 13. If a fluorescent material is provided around the light emitting layer 12, a large portion of light emitted from the light emitting layer 12 will be subjected to wavelength conversion, so that the color of light emitted from the light emitting device tends to be strongly affected by the wavelength-converted light.

The light emitting device according to the first embodiment of the present invention includes a light emitting element 11 having a light emitting layer 12 exposed from the deposited layer of fluorescent material 14, so that the directions of the light emitted from the light emitting element 11 are in a direction to the outside of the light emitting device 100, in a direction toward the upper surface of the light emitting layer 12 passing through the deposited layer of fluorescent material 14 where the wavelength of the light is converted by the fluorescent material 20 having inorganic particles 22 on its surface and to the outside of the light emitting device 100, and in a direction in which the light from the light emitting layer 12 propagates to the deposited layer of fluorescent material 14 which is lower than the light emitting layer 12, where the wavelength of the light is converted by or reflected at the fluorescent material 20 having inorganic particles 22 on its surface, and is emitted outside of the light emitting device 100.

With this arrangement, the light emitted from the light emitting layer 12 can be prevented from being excessively wavelength-converted by the fluorescent material, so that the influence of the color of wavelength-converted light can be suppressed and the state of mixing colors of light can be improved. Also, dependency to the amount (height) of the sealing resin, which is a concern in the case where a fluorescent material is dispersed in a resin, can be reduced, and thus unevenness in the color hue can be suppressed.

Figure 2:
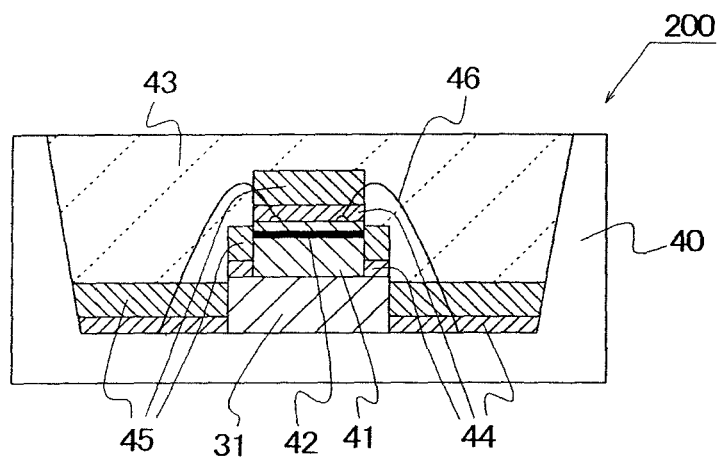
FIG. 2 is a schematic cross-sectional view of a light emitting element according to a second embodiment of the present invention.

Next, a light emitting device according to the second embodiment will be described. FIG. 2 is a schematic view of a light emitting element according to the second embodiment of the present invention. The light emitting device according to the second embodiment is substantially the same as that of the first embodiment, except that the light emitting element 41 is disposed on the submount 31.

It is sufficient that the submount 31 has an upper surface capable of arranging the light emitting element 41 thereon and is preferable that the surface area of the upper surface is larger than the surface area of the bottom surface of the light emitting element 41. In the case where the surface area of the upper surface of the submount 31 is larger than the surface area of the bottom surface of the light emitting element 41, the deposited layer of fluorescent material 44 and the deposited layer of filler 45 are also provided at a portion of the submount 31 exposed from the light emitting element 41 when viewed from the top.

The deposited layer of fluorescent material 44 is such that a part thereof provided on the upper surface of the submount 31 has a smaller surface area and is closer to the light emitting layer 42 than a part thereof provided on the bottom surface defining the recess in the package 40.

Therefore, the wavelength of the light from the light emitting layer 42 is facilitated to be converted at the deposited layer of fluorescent material 44 at the upper surface of the submount 31, thus, the amount of wavelength-converted light can be further reduced. Also, the efficiency of the heat dissipation of the light emitting element 41 can be improved by the submount 31.

The light emitting device according to the third embodiment may have a fluorescent material 20 having inorganic particles 22 on its surface, where the surfaces of the fluorescent material particles 21 are covered with a substantially flat film of a covering material made of a different material than the fluorescent material 21, and are further coated with fine inorganic particles 22. Other arrangements are substantially the same as that in the first or second embodiments.

With this arrangement, the fluorescent material particles 21 having low resistance against moisture and a gas can be protected by the coating material, and dispersion of the fluorescent material 20 having inorganic particles 22 on its surfaces in the uncured resin can be improved by the inorganic particles 22. Each component of the present embodiment will be described in detail below.

The light emitting element is, for example, a semiconductor light emitting element such as a light emitting diode, and any of those used in the art can also be used. The emission peak of the light emitting element is set to, for example, at 460 nm when the light emitting element is used in combination with a YAG-based fluorescent material which will be described later. The light emitting device 100 shown in FIG. 1 exemplifies a light emitting element having positive and negative electrodes on its upper surface, but a light emitting element mounted in flip-chip manner or a light emitting element in which GaN is attached on a Si substrate and the electrodes are disposed respectively on the corresponding sides of the light emitting element can also be used. According to the purpose and application, the composition, the color of emitting light, the size and the number of light emitting element to be employed can be selected appropriately.

The package is provided with a recess defined by a bottom surface capable of mounting a light emitting element thereon. Two lead electrodes (not shown) which are spaced apart from each other are provided on the bottom surface of the recess (a part of the upper surface of the package), and respectively connected to a corresponding external connect terminal. On the bottom surface of the recess provided in the package, a mount for disposing the light emitting element thereon may be formed integrally with the package or a submount or a pedestal may be attached.

The inorganic particles are provided as a coating, to cover the entire surface of the fluorescent particles or to attach to the surface of the fluorescent particles exposing a part of the surfaces of the fluorescent particles. Particularly, the effect is excreted with the fluorescent material where the coating is provided evenly on the entire surfaces of the fluorescent material particles, in either the case where the inorganic particles cover the entire surfaces of the fluorescent material particles or where the inorganic particles cover the surfaces of the fluorescent material particles so that a part of the surfaces of the fluorescent material particles are exposed among the inorganic particles. It is preferable that the coating is applied evenly on the surfaces of the fluorescent material particles, and the state of the coating can either be a thin film or aggregations of fine particles each having a diameter of 1 to 10 nm, as long as the coating is substantially uniform. For the material of the inorganic particles, a metal oxide or a metal nitride is preferable. Examples of such a metal element include Al, Si, or In, Ga or a rare earth element, and with using one or plurality of such elements, a suitable coating can be obtained. The coating may be applied in a plurality of layers, for example, applying a coating of a compound including phosphorus such as a phosphate on the surfaces of the fluorescent material particles and then further applying a coating of inorganic particles thereon.

The fluorescent material particles are coated with inorganic particles and are excited by light from the light emitting element and emit light having wavelength different than that of the excitation light. Examples of the fluorescent material include: (a) a rare-earth aluminate fluorescent material activated mainly with a lanthanoid element such as Ce, and (b) a YAG-based fluorescent material represented by compositional formula such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, or $(Y,Gd)_3(Al,Ga)_5O_{12}$. Fluorescent material particles other than those described above, having similar properties, performance, and effects can also be used. Two or more kinds of fluorescent materials having different specific gravity can be used also. The fluorescent material particles preferably have a specific gravity greater than that of the filler in the deposited layer of filler. Fluorescent material particles and filler having different size may be used, and with mixing them, a further densely packed deposited layer can be obtained.

A resin is a member for sealing a light emitting element, and according to the aim and application, a silicone-based resin such as a phenyl-based silicone resin, a dimethyl-based silicon resin, or a rigid hybrid silicone resin, or an epoxy-based resin can be used.

Fluorescent material particles, fluorescent material having inorganic particles on their surfaces, a filler, a diffusing agent, or the like may be contained in the resin.

The deposited layer of fluorescent material is a deposit formed in such a way that after sealing a light emitting element which is disposed to a package defining a recess with a resin containing a fluorescent material having inorganic particles on its surface, the package is centrifugally rotated so that the fluorescent material which is contained in the resin and which has inorganic particles on its surface is deposited at the light emitting element side. The resin may be contained in the deposited layer of fluorescent material. The deposited layer of fluorescent material is substantially flat with respect to the bottom surface of the package where the light emitting element is disposed.

The deposited layer of filler is a deposit formed in such a way that after sealing a light emitting element which is disposed to a package defining a recess with a resin containing a filler, the package is centrifugally rotated so that the filler which is contained in the resin is deposited at the light emitting element side. The resin may be contained in the deposited layer of filler. The filler contained in the resin contributes to facilitate adjustment of the viscosity of uncured resin before cure, or adjustment of the hardness and the linear expansion coefficient of the cured resin. The filler preferably has a specific gravity smaller than the fluorescent material having inorganic particles on its surface and forming the deposited layer of fluorescent material. The deposited layer of filler is disposed covering the upper surface of the deposited layer of fluorescent material. Also, the filler is deposited covering the entire portion or at least a part of the bonding wires which connect the positive and negative electrodes (not shown) of the light emitting element and the respective metal lead electrodes (not shown) fixed to the package. With the deposited layer of filler, light from the light emitting element (including the wavelength converted light by the fluorescent material having inorganic particles on the surface thereof) can be reflected to improve the light extraction efficiency, and disconnection of wire can be suppressed.

For the filler, silicone dioxide is preferably used for reducing the linear expansion coefficient of the resin, but a white pigment such as alumina, titanium oxide, or barium sulfate may also be used. In order to improve the contrast, a black pigment such as carbon can be employed to an amount so as not to impede propagation of light. Such pigments may be used singly or as combination of two or more thereof. The particle diameter and/or concentration of each member, the mixing ratio of the members, or the like can be appropriately selected.

Figure 3:
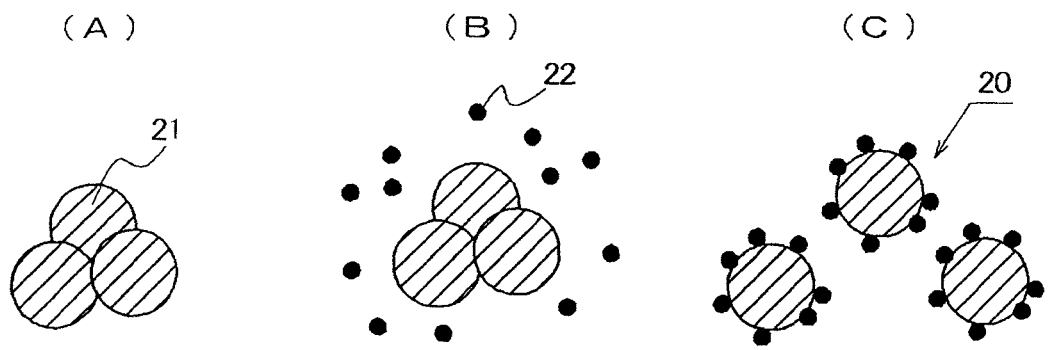
FIGS. 3(A) to 3(C) are schematic views illustrating a step of a method of manufacturing according to the present invention.
Figure 4:
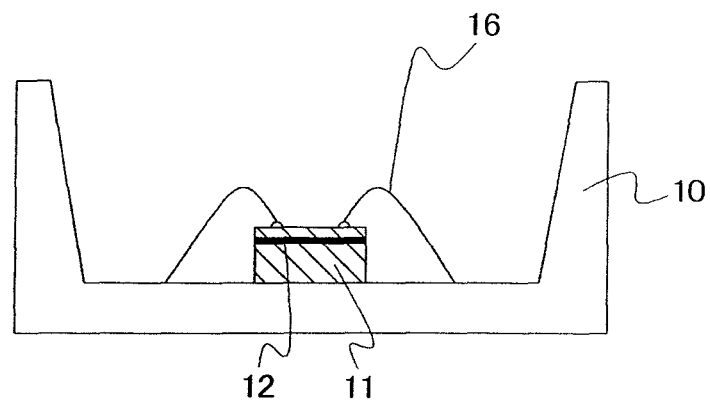
FIG. 4 is a schematic cross-sectional view illustrating a step of a method of manufacturing according to the present invention.
Figure 5:
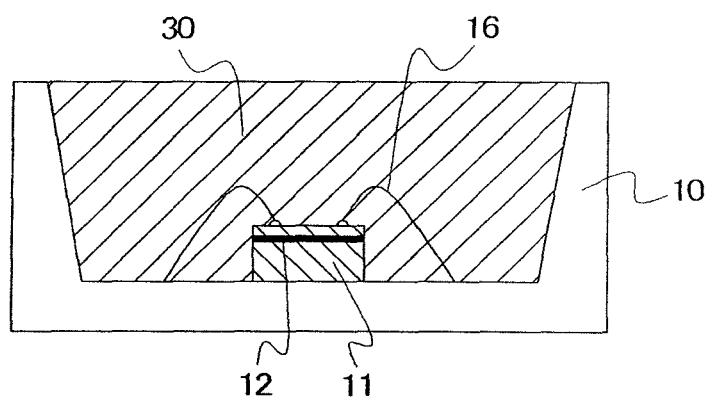
FIG. 5 is a schematic cross-sectional view illustrating a step of a method of manufacturing according to the present invention.

A method of manufacturing a light emitting device according to the present invention will be described below. In addition to those process steps described below, well-know processes may be applicable in making the light emitting device of this invention. FIG. 1 is a schematic cross-sectional view of a light emitting element according to a first embodiment and FIG. 2 is a schematic cross-sectional view of a light emitting element according to a second embodiment. FIGS. 3 to 5 are schematic diagrams each showing a step of a method of manufacturing according to the present invention.

In the method of manufacturing a light emitting device according to the present invention, inorganic particles are provided on the surfaces of fluorescent material particles which tend to aggregate so that occurrence of aggregation of the fluorescent material particles can be avoided and a narrow distribution of the particle diameter can be obtained, and that dispersion of the fluorescent material particles, which have inorganic particles on their surface, in an uncured resin can be improved. With this arrangement, in a step of centrifugal sedimentation, the fluorescent material particles having inorganic particles on their surfaces are facilitated to precipitate evenly and can deposit to form substantially uniform flat surface. Further, the average particle diameter and the specific gravity of the fluorescent material particles having inorganic particles on their surfaces and of the filler are respectively arranged, so that, using a centrifugal sedimentation technique, the fluorescent material particles having inorganic particles on their surfaces are precipitated faster than the filler particles.

The method of manufacturing a light emitting device of the present invention includes a step of mounting a light emitting element 11, a step of preparing a fluorescent material 20, a step of centrifugal sedimentation, and a step of curing resin.

The light emitting element 11 is dye-bonded on the bottom surface of a recess defined in a package 10, then using wires 16, the positive and negative electrodes (not shown) of the light emitting element 11 are connected respectively to the corresponding electrodes (not shown) provided to the package 10.

The light emitting element 11 can be dye-bonded directly on the bottom surface defining the recess in the package 10, or alternatively can arranged on a submount or a pedestal provided on the bottom surface defining the recess in the package 10.

Inorganic particles 22 are applied on the fluorescent material particles 21 to obtain the fluorescent material 20 having inorganic particles thereon. Examples of the method of coating include a method employing a chemical vapor reaction, a method of using a vapor-phase raw material, and a method of using a liquid-phase raw material. Also, a sol-gel method to obtain a coating of silicone oxide by hydrolysis of ethyl silicate may be employed.

Other coating methods can be employed, such as a method in which a source material of metal element, a coreaction material, and the fluorescent material particles are stirred in a solution so as to adhere a target coating substance on the surfaces of the fluorescent material particles, or a method in which an intermediate member is adhered on the surfaces of the fluorescent material particles and then fired in a nitrogen atmosphere to obtain a desired coating. In this specification, the term "coreaction material" refers to a material capable of reacting with the source material of the metal element to form the desired coating.

Examples of other coating methods includes a method in which very small particles of a substance used as a coating material (inorganic particles) and fluorescent material particles are stirred at high speed so as to electrostatiscally adhere the very small particles of the coating material on the surfaces of the fluorescent material particles or a method in which adhesion due to a difference in surface potential, for example, the fluorescent material particles 21 (+) and the inorganic particles 22 (−) before coating, is used for coating. The electrostatic repulsion between the particles due to the surface potential of the inorganic particles 22 improves dispersibility of the fluorescent material particles 20, which have the inorganic particles 22 on the surfaces thereof, in the resin 30. The coating may be applied in a plurality of layers using one or more method described above.

After the mounting step of the light emitting element 11 and the preparation step of the fluorescent material 20, the fluorescent material having inorganic particles on the surface thereof and the filler are mixed into the uncured resin which is in a fluid state, and dispersed to obtain the resin member 30. A diffusing agent may further be contained in the resin 30. The resin 30 is filled in the package 10 by way of potting or printing to seal the light emitting element 11. The resin 30 later takes forms of the transparent resin 13, the deposited layer of fluorescent material 14, and the deposited layer of filler 15, each of which has light transmissive property.

The fluorescent material 20 having inorganic particles 22 on the surface thereof and the filler are centrifugally sedimented after filling the resin 30 in the package 10 to seal the light emitting element 11 and before curing the resin 30. In the step of centrifugally sedimenting the fluorescent material, the direction of the sum of centrifugal force and gravity is maintained substantially perpendicular to the upper surface of the light emitting element. The fluorescent material 20 having inorganic particles 22 on the surface thereof and the filler are uniformly dispersed in the resin 30, so that with maintaining the direction of the force acting on the light emitting device 100 in a direction of the upper surface to the lower surface of the light emitting device 100, deposition of a continuous layer which is closely packed and has a uniform thickness can be obtained. The fluorescent material 20 having inorganic particles 22 on the surface thereof is deposited on the upper surface of the light emitting element 11 and beneath the light emitting layer 12 of the light emitting element 11 to form the deposited layer of fluorescent material 14 and the deposited layer of filler 15 is formed to cover at least the upper surface of the deposited layer of fluorescent material 14.

The thickness of the deposited layer of fluorescent material 14 and the deposited layer of filler 15 can be adjusted respectively to a desired value by adjusting the amount and the particle diameters of the fluorescent material 20 having inorganic particles on the surface thereof and that of the filler.

In the case where a diffusing agent is contained in the resin 30, the diffusing agent is not sedimented in the step of centrifugal sedimentation described above and stays dispersed in the resin 13.

After forming the deposited layer of fluorescent material 14 and the deposited layer of filler 15, the resin 13, the deposited layer of fluorescent material 14, and the deposited layer of filler 15 are hardened to obtain the light emitting device 100 or 200.

EXAMPLE 1

The light emitting device according to Example 1 will be described with reference to FIG. 1. FIG. 1 is a schematic cross-sectional view of a light emitting device according to the first embodiment of the present invention, and the light emitting device 100 was fabricated as described below.

The light emitting device 100 according to Example 1 includes a package 10, a light emitting element 11 having a light emitting layer 12, a resin 13, a deposited layer of fluorescent material 14, a deposited layer of filler 15, and wires 16. The resin 13, the fluorescent material particles 21, the inorganic particles 22, and the filler used in Example 1 were as follows.

(1) Resin 13
Type: Phenyl-containing silicone resin
Viscosity: 200 to 20000 mPa·s
(2) Fluorescent Material Particle 21
Composition: $Y_3Al_5O_{12}$:Ce
Specific Gravity: 4.6
Average Diameter: 10.5 μm
Median Particle Diameter: 12.5 μm
(3) Inorganic Particle 22
Type: Colloidal Silica ($SiO_2$)
Average Particle Diameter: 10 to 20 nm
(4) Filler
Composition: $SiO_2$
Specific Gravity: 2.2
Average Diameter: 6.8 μm In Example 1, first, a light emitting element 11 was mounted on the bottom surface of the recess which was defined in the package 10 and which was provided with lead electrodes (not shown). Then the positive and negative electrodes (not shown) disposed on the upper surface of the light emitting element 11 were respectively connected to the lead electrodes through the wires 16.

Meanwhile, making use of respective surface potentials, the inorganic particles 22 are coated on the fluorescent material particles 21 to obtain the fluorescent material 20 having inorganic particles thereon.

The fluorescent material 20 having the inorganic particles 22 on the surface thereof and the filler were mixed in the uncured resin which was in a fluid state and were dispersed to obtain the resin member 30. The resin member 30 was filled in the package 10 to seal the light emitting element 11.

Then, without hardening the resin member 30, the fluorescent material 20 having the inorganic particles 22 on the surface thereof and the filler were sedimented by applying a centrifugal force. The fluorescent material 20 having inorganic particles 22 on the surface thereof was deposited on the upper surface of the light emitting element 11 and below the light emitting layer 12 and the filler was deposited on the upper surface of the fluorescent material 20 having inorganic particles 22 on the surface thereof. Thus, the deposited layer of fluorescent material 14 and the deposited layer of filler 15 were formed.

Finally, the resin member was hardened under a condition of at 50° C. for 12 hours, then the temperature was rised to 50° C. to 150° C. in 2 hours, and at 150° C. for 4 hours. Thus the light emitting device 100 was obtained.

The light emitting device 100 according to Example 1 was fabricated as described above, and thus, the light emitting device 100 capable of suppressing occurrence of unevenness of color and of improving the color properties in light distribution can be obtained.

Light emitting device according to the present invention can be suitably employed for a light source for lighting, an LED display, backlight source for a liquid crystal display device, signals, a lighted switch, various sensors, various indicators, or the like.

I claim:

1. A method of manufacturing a light emitting device, comprising:
    mounting a light emitting element in a recess of a package;
    connecting the package and the light emitting element with bonding wires;
    providing a resin containing a fluorescent material and a filler mixed therein;
    sealing the light emitting element mounted in the recess of the package with the resin; and
    applying a centrifugal force to the sealed package so that the fluorescent material and the filler are pushed toward a bottom of the recess and forming a deposited layer comprising filler, the filler being deposited covering at least a part of the bonding wires.

2. The method of claim 1, wherein, during the application of the centrifugal force, a sum of the centrifugal force and gravity has a direction perpendicular to a top surface of the light emitting element.

3. The method of claim 1, wherein, the deposited layer of filler is disposed covering an upper surface of a deposited layer comprising fluorescent material.

4. The method of claim 1, wherein the resin further comprises a diffusing agent.

5. The method of claim 1, wherein the package includes positive and negative lead electrodes and the light emitting element includes positive and negative electrodes, and wherein connecting the package and the light emitting element with bonding wires comprises connecting the positive and negative lead electrodes of the package to the respective positive and negative electrodes of the light emitting element with bonding wires.

6. The method of claim 1, wherein the fluorescent material comprises fluorescent particles having inorganic particles disposed on surfaces of the fluorescent particles.

7. A light emitting device, comprising:
    a light emitting element having a light emitting layer;
    a package having a recess in which the light emitting element is mounted;
    bonding wires connecting the light emitting element and the package;
    a layer comprising a fluorescent material deposited on portions of a bottom of the recess;
    a filler layer comprising a filler deposited on the layer comprising the fluorescent material;
    wherein the filler layer covers at least a part of the bonding wires and a side face of the light emitting layer and wherein the side face of the light emitting layer is not covered by the layer comprising the fluorescent material; and
    a resin sealing the light emitting element, the layer comprising the fluorescent material and the filler layer comprising the filler in the recess of the package.

8. The light emitting device of claim 7, wherein the filler comprises at least material selected from the group consisting of silicon dioxide, alumina, titanium oxide and barium sulfate.

9. The light emitting device of claim 7, wherein the fluorescent material comprises fluorescent particles having inorganic particles disposed on surfaces of the fluorescent particles.

10. The light emitting device of claim 7, wherein an entire portion of the bonding wire is covered by the filler layer.

11. The light emitting device of claim 7, wherein the bottom of the recess is partially raised by placing a submount on the bottom, the light emitting element is disposed on the submount, and part of the layer comprising the fluorescent material and part of the filler layer are disposed on the submount so that the filler layer covers the side edge of the light emitting layer.

12. The light emitting device of claim 7, wherein the light emitting element comprises GaN.

13. The light emitting device of claim 7, wherein the fluorescent particles comprise YAG-based fluorescent material.

14. The light emitting device of claim 7, wherein the package includes positive and negative lead electrodes, the light emitting element includes positive and negative electrodes, and the bonding wires connect the positive and negative lead electrodes of the package to the respective positive and negative electrodes of the light emitting element.

15. The light emitting device of claim 7, wherein the resin further comprises a diffusing agent.

16. The light emitting device of claim 15, wherein the diffusing agent has the same specific gravity as the resin.

17. The light emitting device of claim 9, wherein the filler is made of a material different than the material of which the inorganic particles are made.

18. The light emitting device of claim 9, wherein the inorganic particles are made of a material including at least one element selected from the group consisting of Al, Si, In, Ga and a rare earth element.

19. The light emitting device of claim 9, wherein the inorganic particles are made of a metal oxide or a metal nitride including the at least one element selected from the group consisting of Al, Si, In, Ga and a rare earth element.

20. The light emitting device of claim 7, wherein the filler comprises a material selected from the group consisting of silicon dioxide, alumina, titanium oxide and barium sulfate.

21. The method of claim 4, wherein the diffusing agent has the same specific gravity as the resin.

22. The method of claim 6, wherein the filler is made of a material different than the material of which the inorganic particles are made.

23. The method of claim 6, wherein the inorganic particles are made of a material including at least one element selected from the group consisting of Al, Si, In, Ga and a rare earth element.

24. The method of claim 6, wherein the inorganic particles are made of a metal oxide or a metal nitride including the at least one element selected from the group consisting of Al, Si, In, Ga and a rare earth element.

25. The method of claim 1, wherein the filler comprises a material selected from the group consisting of silicon dioxide, alumina, titanium oxide and barium sulfate.

26. A light emitting device, comprising:
a light emitting element having a light emitting layer,
a package having a recess in which the light emitting element is mounted;
a layer comprising a fluorescent material deposited on portions of a bottom of the recess;
a filler layer comprising a filler deposited on the layer comprising the fluorescent material, wherein the filler layer covers a side face of the light emitting layer and wherein the side face of the light emitting layer is not covered by the layer comprising the fluorescent material, and
a resin sealing the light emitting element, the layer comprising the fluorescent material and the filler layer comprising the filler in the recess of the package.

* * * * *